(12) United States Patent
Visconti et al.

(10) Patent No.: US 7,471,571 B2
(45) Date of Patent: Dec. 30, 2008

(54) METHOD FOR PROGRAMMING A MEMORY DEVICE SUITABLE TO MINIMIZE THE LATERAL COUPLING EFFECTS BETWEEN MEMORY CELLS

(76) Inventors: Angelo Visconti, Via Colombo, 27, Appiano Gentile (IT) 22070; Mauro Bonanomi, Via Q. di Vona, 57, Cassano D'Adda (IT) 20062

( * ) Notice: Subject to any disclaimer, the term of this patent is extended or adjusted under 35 U.S.C. 154(b) by 348 days.

(21) Appl. No.: 11/348,513

(22) Filed: Feb. 6, 2006

(65) Prior Publication Data
US 2006/0203544 A1   Sep. 14, 2006

(30) Foreign Application Priority Data
Feb. 4, 2005   (EP) .................................. 05425052

(51) Int. Cl.
*G11C 11/34* (2006.01)
(52) U.S. Cl. ............................ 365/185.29; 365/185.11; 365/185.18
(58) Field of Classification Search ............ 365/185.29, 365/185.18, 185.11
See application file for complete search history.

(56) References Cited

U.S. PATENT DOCUMENTS

| | | | | |
|---|---|---|---|---|
| 5,867,429 A | 2/1999 | Chen et al. | ............. | 365/185.33 |
| 5,875,130 A | 2/1999 | Haddad et al. | ......... | 365/185.33 |
| 6,151,248 A | 11/2000 | Harari et al. | ........... | 365/185.14 |
| 6,252,803 B1 * | 6/2001 | Fastow et al. | .......... | 365/185.22 |
| 6,735,114 B1 * | 5/2004 | Hamilton et al. | ....... | 365/185.03 |
| 2003/0002348 A1 | 1/2003 | Chen et al. | ............. | 365/189.01 |

* cited by examiner

*Primary Examiner*—Son Dinh
(74) *Attorney, Agent, or Firm*—Trop, Pruner & Hu, P.C.

(57) ABSTRACT

A method programs a memory device that includes at least one memory cell matrix. The programming method the steps of: erasing the memory cells; soft programming the memory cells; and complete programming of a group of such memory cells each of them storing its own logic value. Advantageously, the first complete programming step of a group of such memory cells involves cells belonging to a block (A) of the matrix being electrically insulated from the rest of the matrix. A memory device suitable to implement the proposed method is also described.

20 Claims, 6 Drawing Sheets

METHOD FOR PROGRAMMING A MEMORY DEVICE SUITABLE TO MINIMIZE THE LATERAL COUPLING EFFECTS BETWEEN MEMORY CELLS

BACKGROUND OF THE INVENTION

1. Field of the Invention

The present invention relates to a method for programming a memory device suitable to minimize the lateral coupling effects between memory cells.

More specifically, the invention relates to a method for programming a memory device of the type comprising at least one memory cell matrix, the method comprising the steps of:
   erasing of said memory cells;
   soft programming of said memory cells; and
   complete programming of a group of said memory cells, each of them storing its own logic value.

The invention also relates to a memory device suitable to implement the proposed method.

The invention particularly, but not exclusively, relates to a memory device of the Flash type and the following description is made with reference to this field of application for convenience of explanation only.

2. Description of the Related Art

As it is well known, the continuous decrease (the so called shrinking) of integrated device sizes in modern technologies brings about several problems.

In particular, in the case of memory devices, the more and more reduced distances between memory cells makes the electrical interactions between adjacent cells in the usual cell matrix structures stronger and stronger.

It is in fact to be remembered that the elements of a Flash memory device are substantially floating gate memory cells, realized on a semiconductor substrate 1 wherein a source region 2 and a drain region 3 are defined as well as a body region 4 interposed between the source 2 and the drain 3 region, the substrate 1 being overlapped by a first dielectric layer 5, so called gate dielectric, by a first polysilicon layer, known as poly1 and defining the floating gate 6, by a second dielectric layer 7, so called dielectric interpoly, and by a second polysilicon layer, known as poly2 and defining the control gate 8, as schematically shown in FIG. 1, which represents a floating gate memory cell, globally and schematically indicated with 10.

The integrated structure of the memory cell 10 has different capacitive couplings due to the alternation of conductive and insulating layers, and in particular the following capacitances are defined:
   $C_{GS}$: between the floating gate 6 and the source region 2;
   $C_{GD}$: between the floating gate 6 and the drain region 3;
   $C_{GB}$: between the floating gate 6 and the body region 4; and
   $C_I$: between the polysilicon layers defining the floating gate 6 and the control gate 8.

Such capacitive couplings also involve the cell matrix as a whole, where there is a same alternation of dielectric/conductive layers and in particular it results to be relevant between the floating gates of consecutive cells inside the matrix.

It has been however verified that, for the technologies being currently available at 0.15 μm, the capacitive coupling between the floating gates of adjacent cells can be considered negligible. In this case, it is possible to model each memory cell in its electrical behavior as independent from the adjacent cells.

In reality, for the currently developing technologies, and, all the more reason, for future ones, such capacitive interaction between adjacent cells is no more negligible and therefore it is to be considered in the correct description of the cell electric behavior.

FIG. 2 shows, by way of example, a matrix 20 of memory cells 10, organized in a known way in rows, or wordlines WL, and columns, or bitlines BL, also indicating the possible capacitive lateral couplings Cx, Cy and Cxy which establish between floating gates 6 of adjacent cells.

The mutual capacitive coupling between adjacent memory cells particularly implies an alteration of the threshold value of a cell under examination, when the threshold values of adjacent cells vary, i.e. when their operative conditions vary.

In particular, such mutual coupling can be represented by means of the following relation:

$$\alpha_{acc} = (2Cx + 2Cxy + Cy)/Ctot;$$

$\alpha_{acc}$ being a multiplicative constant which takes into account the coupling between adjacent cells;

Cx, Cxy and Cy being the values of the parasite capacitances due to the lateral couplings of adjacent cells; and Ctot being the global value of the capacitances connected to the floating gate of a cell.

With the decrease of the integration geometries and thus of the distances between adjacent cells, the ratio between the lateral parasite capacitances Cx, Cxy and Cy and the total capacitance Ctot increases: the threshold value of a cell thus becomes a function also of adjacent cell thresholds.

In particular, during the programming step of the memory matrix, the floating gates of the cells being programmed are brought to a low potential value.

Taking into consideration a given cell there occurs that, due to the above-described capacitive coupling, such potential value is at least partially transferred to its floating gate from the floating gates of adjacent cells being programmed.

This alteration of the floating gate potential turns out as an increase of the threshold value of the cell under test, even in the case wherein the neat charge of its floating gate has not been changed and thus its status has not been changed, i.e. of the value stored therein between the possible logic values.

This phenomenon is even more marked in the case of Flash memory devices, in which all the cells of a sector are erased all together and then selectively programmed. In particular, it should be noted that the threshold increase effect also involves cells having been already correctly programmed which are however adjacent to a cell being programmed.

For two-level or single bit memory devices, such threshold increase during the programming step is not problematic if the "disturbed" cells store logic "0" values. Vice versa this interaction can be dangerous if the "disturbed" cells store logic "1" values, corresponding to a low threshold value, since the threshold margin, suitably designed for a correct reading of the memory device during its life, is reduced.

Moreover, for multilevel memory devices, the above-indicated problems for two-level memory devices, are worsened since, besides the case of the low threshold level or minimum level, also in the case of possible intermediate levels a shift of the cell threshold values can lead to reading errors of the memory device itself.

For maintaining the threshold margins unaltered between the distributions of the various levels and the corresponding reading references usually used for reading the memory device it is consequently necessary to increase the separation in terms of threshold values between the references relative to the possible programmed levels of an amount equal to the maximum disturb a cell can have, and thus to widen the so-called threshold window. In substance, the parasitic widening of the threshold distribution due to the interaction between adjacent cells is to be taken into account.

All this leads however to have a reduced reliability due to the general increase of the electrical fields in retention, as schematically shown in FIGS. 3A and 3B where the distributions of the threshold values are shown for different levels of a multilevel device, in particular able to store two bits for memory cell, in the case of standard positioning of the references (FIG. 3A) and with the references positioned considering the distribution widening caused by the lateral couplings (FIG. 3B).

In particular, such figures indicate with:
DV the voltage reference of the so called depletion verify;
EV the erasing verify voltage reference;
R1 a first reading voltage reference;
$PV_1$ the programming verify voltage reference of a first programmed level;
R2 a second reading voltage reference;
$PV_2$ the programming verify voltage reference of a second programmed level;
R3 a third reading voltage reference; and
$PV_3$ the programming verify voltage reference of a third programmed level.

In particular, by comparing FIG. 3A and FIG. 3B it is immediate to verify how each threshold distribution of the considered levels widens, an effect of the lateral parasitic couplings between adjacent cells, of a maximum level $\Delta V_{T,acc}$ equal to:

$$\Delta V_{T,acc} = \alpha_{acc} \Delta V_{Tcells\_lateral};$$

wherein
$\Delta V_{T,acc}$ is the maximum threshold voltage variation of a cell under examination;
$\alpha_{acc}$ is the coupling multiplicative constant; and
$\Delta V_{Tcells\_lateral}$ is the threshold voltage variation of the cells being adjacent to the cell under test, further to the programming thereof.

Such shift of the threshold distributions makes the use of different positions of the voltage references for reading the different levels necessary, with a total shift (the shift of the last considered level) equal to $3\Delta V_{T,acc}$.

Particular integration technologies are also known able to reduce such shifts of the threshold levels by minimizing the capacitive couplings between adjacent cells obtained by modifying the method for integrating the cells themselves. The memory devices thus obtained have therefore reduced values of the capacitive couplings between adjacent cells which reduce, but do not eliminate, the phenomenon of the threshold level variations, these latter continuing however to limit the use of the memory devices thus obtained, in particular in case of multilevel applications.

BRIEF SUMMARY OF THE INVENTION

One embodiment of the present invention provides a method for programming memory devices, in particular of the multilevel type, having structural and functional characteristics which allow to minimize the effects of the parasitic capacitive couplings between adjacent cells, in this way overcoming the limits which still affect the devices realized according to the prior art.

One embodiment of the present invention provides a simultaneous programming step of a plurality of cells contained inside electrostatically insulated blocks.

The characteristics and advantages of the programming method and of the memory device according to the invention will be apparent from the following description of embodiments thereof given by way of indicative and non limiting example with reference to the annexed drawings.

BRIEF DESCRIPTION OF THE SEVERAL VIEWS OF THE DRAWINGS

In such drawings.

DETAILED DESCRIPTION OF THE INVENTION

Figure 1:
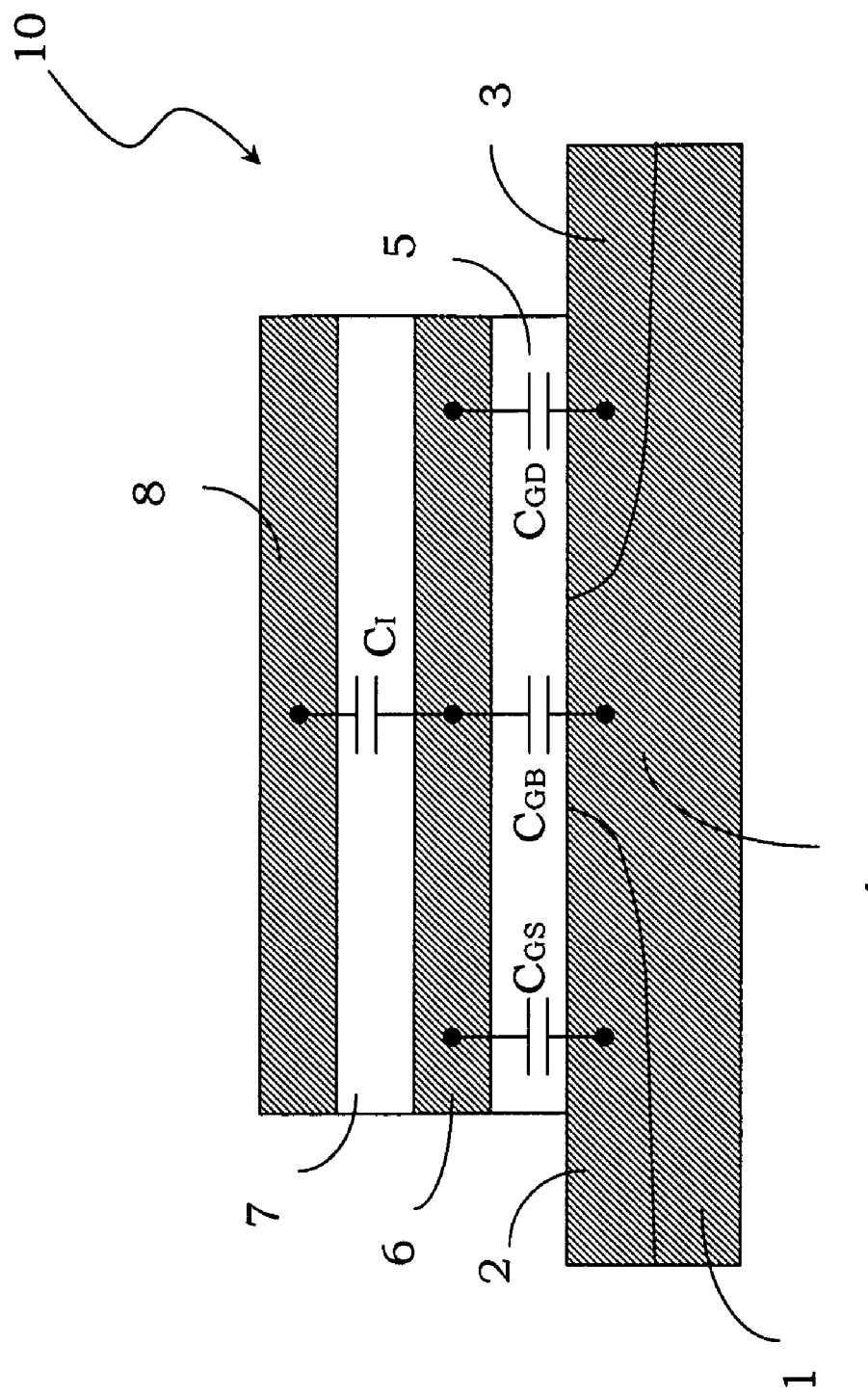
FIG. 1 schematically shows a floating gate memory cell realized according to the prior art.
Figure 2:
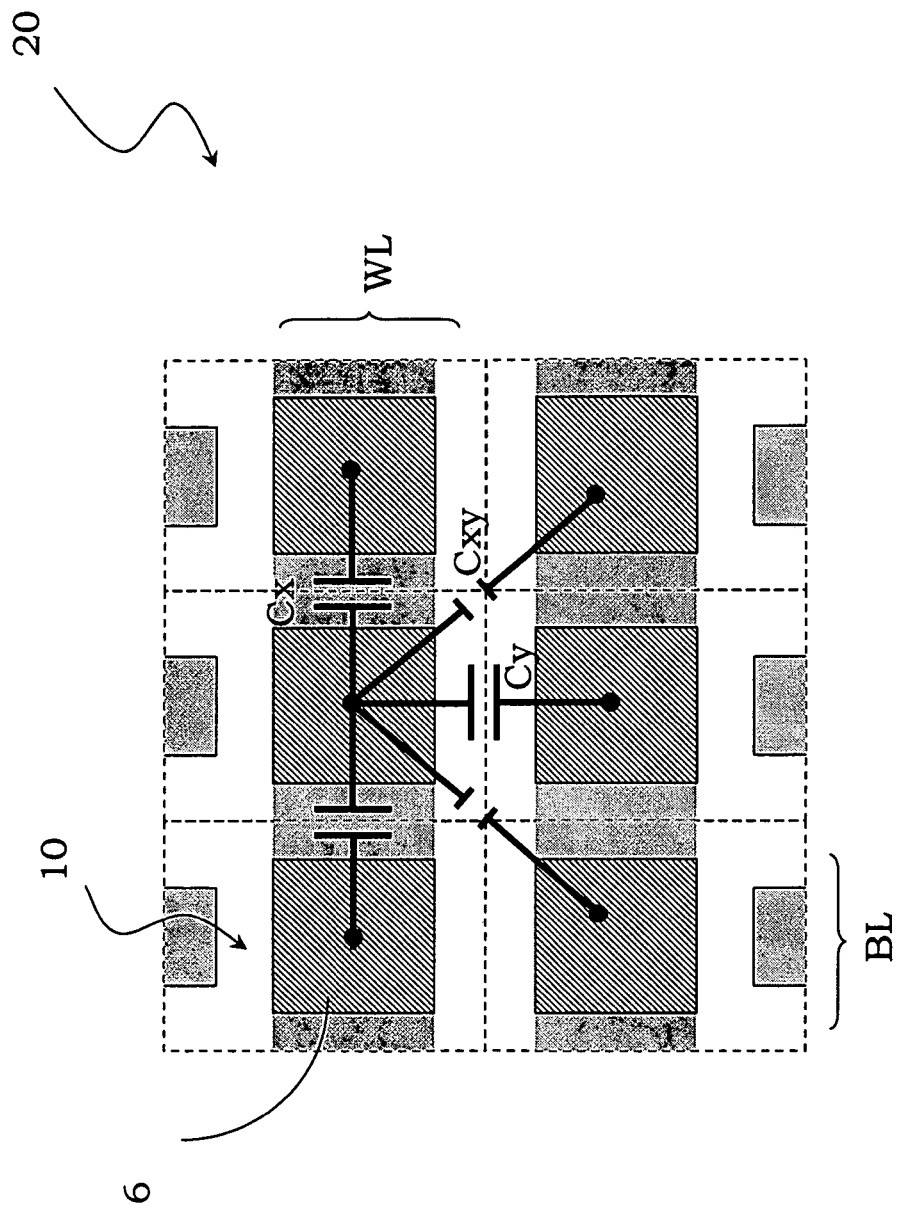
FIG. 2 schematically shows a memory cell device realized according to the prior art.
Figures 3A, 3B:
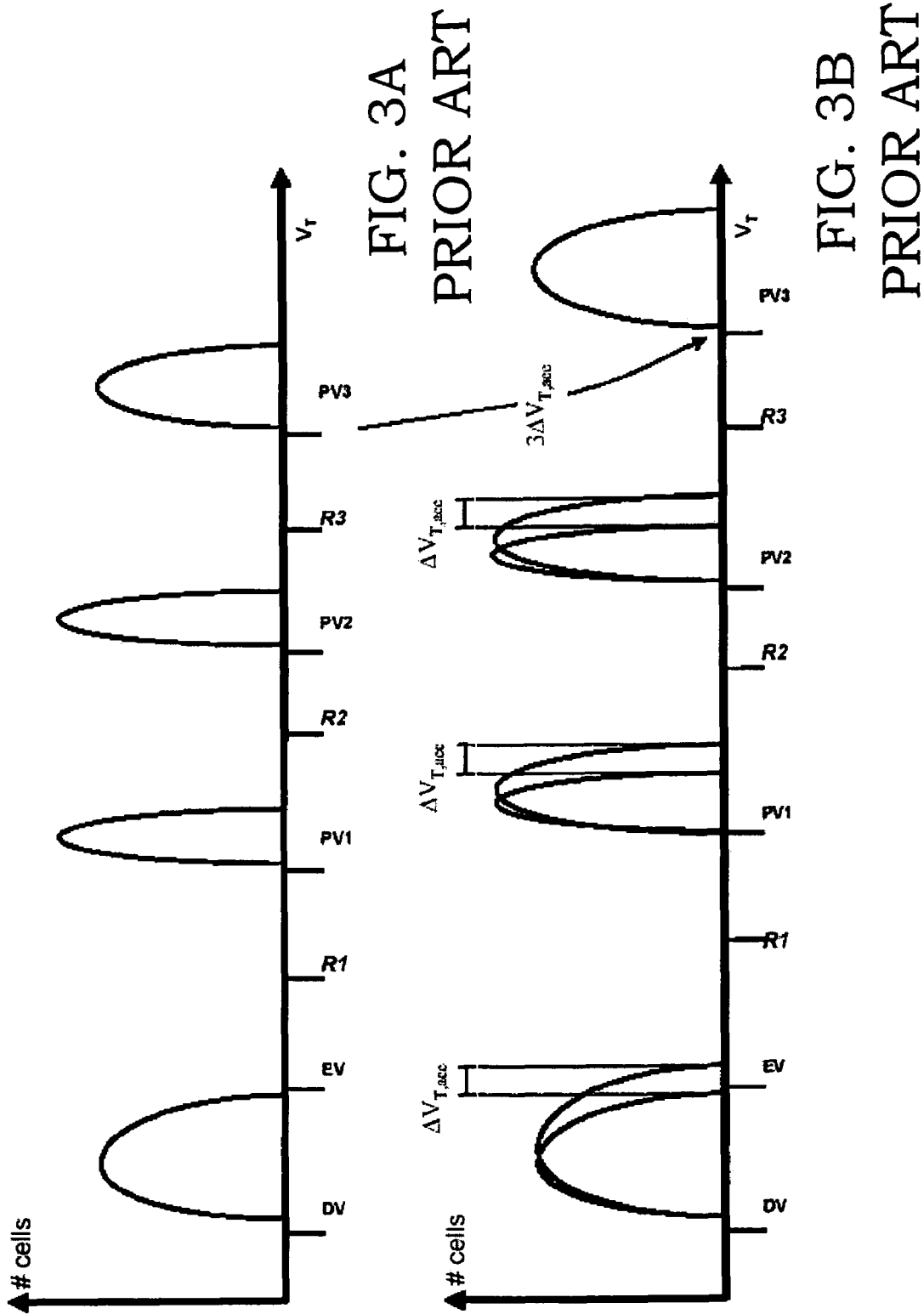
FIGS. 3A and 3B schematically show the threshold distributions of the memory cells of the device of FIG. 2 in different operative conditions.
Figure 4A:
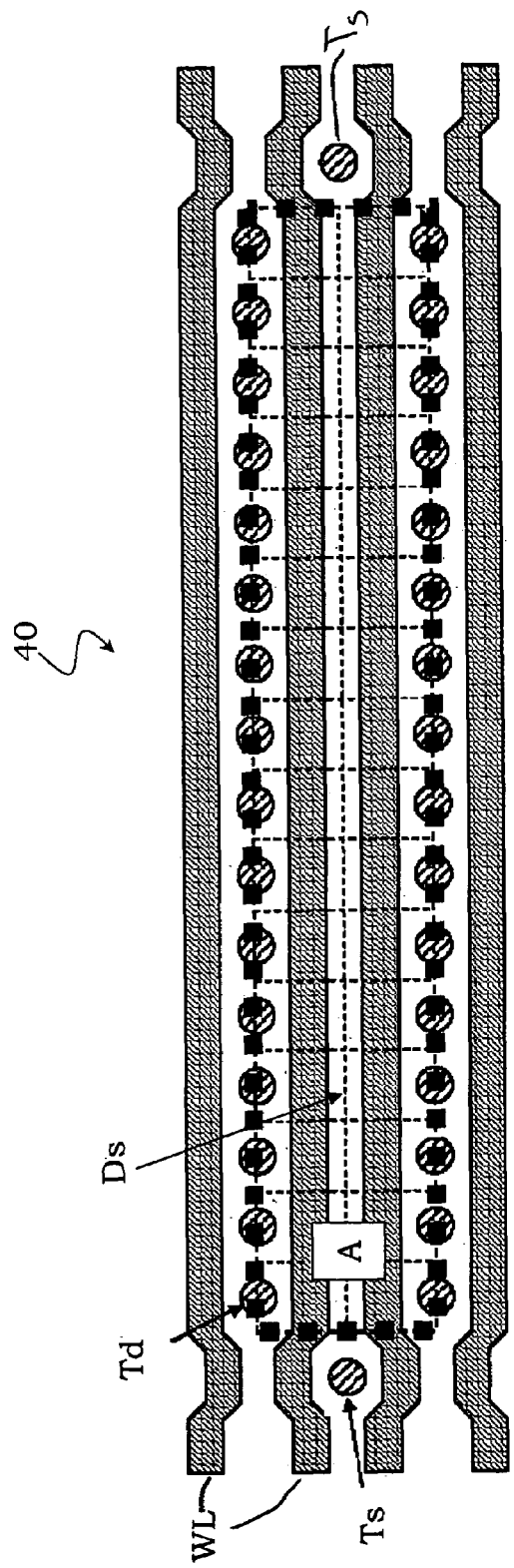
FIGS. 4A and 4B schematically show a cell matrix portion of a memory device whereto a programming method according to one embodiment of the invention is applied.
Figure 4B:
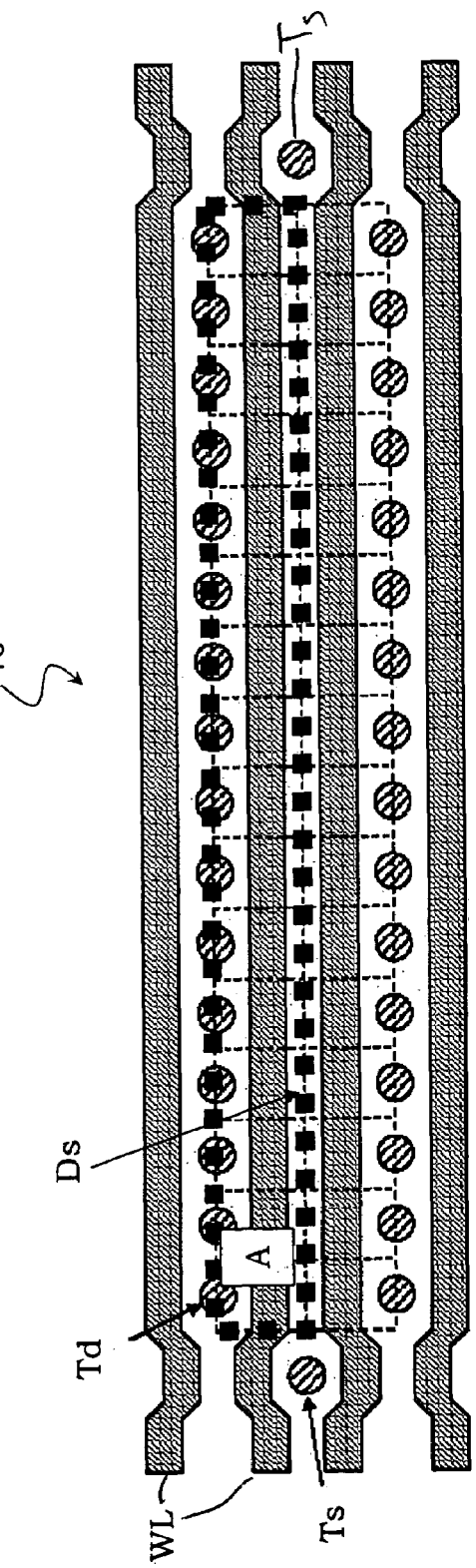

With reference to such figures, and in particular to FIGS. 4A and 4B, 40 generally and schematically indicates a memory device whereto the programming method according to one embodiment of the present invention is applied.

In particular, the proposed programming method is based on the consideration that a memory cell matrix can be considered as divided into a plurality of memory cell blocks A substantially electrically insulated from one another, indicated with dot lines in FIGS. 4A and 4B.

In FIG. 4A such blocks A are defined by source Ts and drain Td contacts, whose presence makes the coupling between cells belonging to two consecutive blocks A negligible.

In FIG. 4B such blocks A are defined by source Ts and drain Td contacts as well as by the source diffusion, for a device wherein the lateral capacitance Cy between cells belonging to different word lines can be considered low.

Advantageously, the programming method of a memory device thus provides an initial separation and redistribution step of a sequence of bytes in bit packages each to be allotted to one of such blocks A of the memory matrix.

In substance, the cells to be programmed are considered as grouped into electrostatically insulated blocks, reducing the capacitive coupling during the programming step of the cells of different blocks.

In such way, the programming can also be carried out on at least two word lines, simultaneously.

Moreover, for cells inside a same block A, the state whereto they have to be brought being known a priori, the effects of the coupling disturbs are advantageously reduced by means of a suitable sequence of programming steps.

It is in fact remembered that the coupling disturbs produce a variation of the threshold voltage which can be expressed with the relation:

$$\Delta V_{T,acc} = \alpha_{acc} \Delta V_{Tlateral\_cells}$$

being
$\Delta V_{T,acc}$ the threshold voltage variation of a cell under test due to the capacitive coupling of the adjacent cells;
$\alpha_{acc}$ a coupling multiplicative constant; and $\Delta V_{Tlateral\text{---}cells}$ the threshold voltage variation of the cells being adjacent to the cell under test, further to the programming thereof.

It has been thus considered how the cells programmed at a "0" logic value, or "0" cells are the cells for which a threshold increase due to successive programming steps of adjacent cells is less problematic. On the other hand, exactly the programming step of cells "0" is that linked to the major disturb $\Delta V_{T,acc\,Max}$ to adjacent cells for a value equal to $\alpha_{acc}\Delta V_{T,0\text{-}1}$.

Advantageously, the programming method provides to compensate such disturb with a positioning of the erasing voltage reference to a reduced value equal to $EV-\Delta V_{T,acc\,Max}$.

In particular, the programming method, applied to the worst case of a memory device of the Flash type, comprises the steps of:
  erasing of a memory matrix sector by using such reduced value of the erasing voltage reference $EV-\Delta V_{T,acc\,Max}$; and
  soft programming of such memory matrix sector.

It should be noted that the initial erasing step can obviously be carried out bit by bit.

In such way, the initial erasing step is self-compensated with respect to the capacitive couplings of adjacent cells.

Moreover, advantageously, the programming method provides the steps of:
  complete programming, wherein a first cell group of a determined block A is programmed which store a logic value equal to "0", or cells "0"; and
  partial programming of a second cell group of block A which store a logic value equal to "1", or cells "1" suitable to bring them to a level near a first reduced threshold level PV', fixed so as to be however lower than a threshold value PV desired for the device.

These initial programmings, also indicated as pre-programmings, can disturb each other, but advantageously they are suitably calibrated so that the threshold reached by the cells at the end of the pre-programming—threshold which also comprises the mutual disturb—is lower than the threshold value PV desired for the memory device.

The programming method thus provides the steps of:
  complete final programming of the cells "1" of block A by means of a sequence of tests and subsequent programming pulses $V_{G,Prog}$.

In particular, this pulse sequence is staircase-like performed with constant increases of the pulse width equal to $\Delta V_{G,Prog}$.

Per each one of these programming pulses $V_{G,prog}$ a test with respect to the threshold value PV is performed on each cell and prior to the pulse. If such test fails, the programming pulse $V_{G,prog}$ is then applied.

After the test and the subsequent application of a cell pulse the subsequent cell is considered to perform the test thereon and, possibly, the application of the relevant pulse.

When all the cells of the block to be programmed have been scanned $V_{G,prog}$ is increased of the amount $\Delta V_{G,prog}$ and the test and pulse sequence is repeated as above described.

This complete final programming step ends when the test on all the cells of the matrix block A gives a positive result. In such case in fact, all the cells have overcome the threshold value PV and the data writing has finished.

It should be noted that the complete final programming step introduces a maximum disturb equal to $\alpha_{acc\Delta VPV-PV'}$, the maximum widening of the threshold distribution of the cells "1" for capacitive coupling being given by the situation wherein the cell under test is, after the pre-programming step, above the threshold value PV and all the near cells are at the reduced threshold value PV'.

Thus, globally, the widening of the threshold window for capacitive coupling is reduced with respect to the programming methods realized according to the prior art.

Advantageously, the programming method thus provides the repetition of the pre-programming steps and of final programming on all the cell matrix blocks A of the considered memory device.

The advantages obtained with the programming method are even more important in case of a multilevel memory device programming.

Even in this case, it is observed that the cells "00" are the cells for which a threshold increase due to subsequent programming steps of adjacent cells is less problematic. Moreover, the programming step of cells "00" is that linked to the major disturb to adjacent cells.

In reality, such disturb hits the only cells which remain at the value "11", since the cells suitable to store the values "10" and "01" still have to be programmed at their respective level.

Moreover, such disturb is the maximum disturb for the cells "11" and it is equal to $\alpha_{acc}\Delta V_{T,00\text{-}11}$. Advantageously, it is provided to compensate this maximum disturb value with a positioning of the erasing voltage reference to $EV-\Delta V_{T,acc\,Max}$.

The programming method thus comprises, in a similar way to the two-level case, the steps of:
  erasing of a sector of the memory matrix by using a reduced value of the erasing voltage reference $EV-\Delta V_{T,acc\,Max}$; and
  soft-programming of such sector of the memory matrix.

Moreover, advantageously, the programming method provides the step of:
  complete programming, wherein a first group of cells of a determined block A is programmed, which store a logic value equal to "00", or cells "00";
  partial programming of a second group of cells of the block A which store a logic value equal to "01", or cells "01" suitable to bring them to a level near a reduced threshold voltage $PV_2'$, fixed so as to be however lower than a threshold value $PV_2$ of second level; and
  partial programming of a third group of cells of the block A which store a logic value equal to "10", or cells "10", suitable to bring them to a level near a reduced threshold value $PV_1'$, fixed so as to be however lower than a threshold value $PV_1$ of first level.

Also in this case, and all the more reason with respect to the two-level case, these programming steps, also indicated as pre-programming, disturb each other. They are thus suitably calibrated so that the threshold reached by the cells at the end of each partial programming—threshold which also comprises the mutual disturb—is suitably lower than the threshold of the respective level threshold value PV.

The programming method thus comprises the steps of:
  complete final programming of the cells "01" and "10" of the block A by means of a sequence of tests and subsequent programming pulses $V_{G,Prog}$.

As previously seen, this pulse sequence is staircase-like performed with constant increases of the pulse width equal to $\Delta V_{G,Prog}$.

For each one of such programming pulses $V_{G,prog1,2}$ on each cell and prior to the pulse a test with respect to the threshold value PV is performed. If such test fails, the programming pulse $V_{G,prog1,2}$ is then applied. After the test and pulse of a cell the subsequent cell is taken into consideration for applying the test and the relevant pulse.

When all the cells to be programmed of the block have been scanned $V_{G,prog1,2}$ is increased of the amount $\Delta V_{G,prog}$ and the sequence of tests and pulses is repeated.

In particular, this final programming step comprises, for each cell "10" and "01", the following steps:

test of the threshold value of the cell with respect to the corresponding level, PV, respectively $PV_2$ if such threshold value is lower than the level, $PV_1$, respectively $PV_2$, application of a programming pulse $V_{G,prog1,2}$ if at least a cell with threshold value still lower than the level, $PV_1$, respectively $PV_2$, remains, increase of the programming step $V_{G,prog1,2}$.

This complete final programming step ends when the test of all the cells "10" and "01" of the matrix block A gives a positive result. In such case in fact, all the cells have overcome the corresponding threshold value, $PV_1$, and $PV_2$ respectively, and the data writing has finished.

The programming method thus provides the repetition of the pre-programming and final programming steps on all the cell matrix blocks A of the considered memory device.

Even in such case, the complete final programming step introduces a maximum disturb on the cells "01" and "10" equal to $\alpha_{acc \Delta PV-PV'}$, the maximum widening of the threshold distribution for capacitive coupling being given by the situation wherein the cell under test is after the pre-programming steps above the threshold value PV and all the near cells are at the reduced threshold value PV'.

It is immediate to verify that the widening of the threshold window for capacitive coupling is thus reduced, for the contribution of the two central distributions $PV_1$, and $PV_2$, of a factor $\Delta V_{P-P'' \Delta VT,00-11}$.

Figure 5:
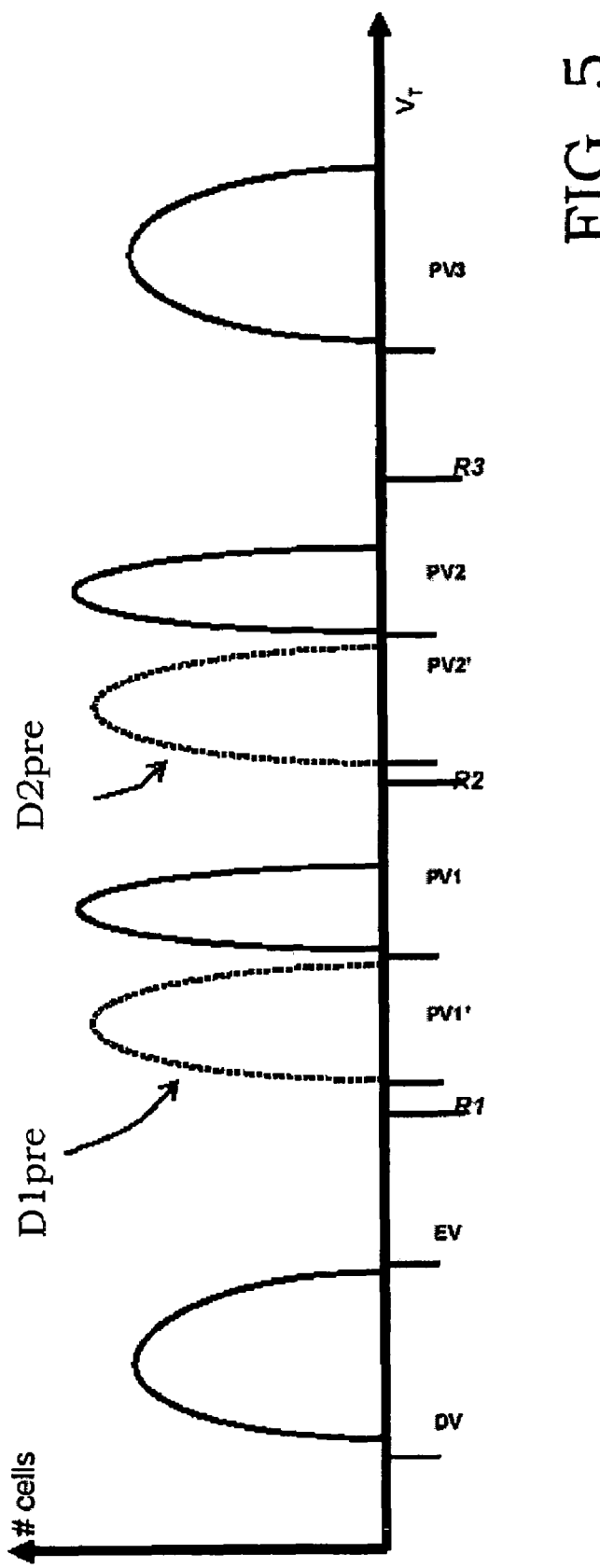
FIG. 5 schematically shows the threshold distribution of a memory device using the method according to one embodiment of the invention.

In particular, as shown in FIG. 5, the total widening of the threshold window between the threshold distribution of the cells "11", indicated with DV, and the threshold distribution of the cells "00", indicated with $PV_3$—with equal margins—goes down from the value which can be obtained with the known methods of $\Delta V_{11} + \Delta V_{10} + \Delta V_{01} = 3 \alpha_{acc} \Delta V_{T,00-11}$ to a reduced value equal to:

$\alpha_{acc} \Delta V_{T,00}-11 + 2\alpha_{acc} \Delta V_{P-P'}$ by using the programming method as just described.

For example, considering the following values:

$\Delta V_{T,00-11} \cong 4V \; \Delta V_{P-P'} \cong 0.5V \; \alpha_{acc} = 0.1$ the following widenings of the threshold distribution window are obtained:

3*0.4V=1.2V for the known methods; and 0.4V+2*0.05V=0.5V in the case of the method described above.

Thus, advantageously, apart from the widening by capacitive coupling of the threshold distribution of the cells "11"—identical to the known methods—the widening by capacitive coupling of the threshold distribution of the cells "10" and "01" of the central levels is drastically reduced and its contribution is negligible in the measuring of the overall widening of the threshold distributions of the multilevel device which substantially corresponds to the widening of the cells "11".

In particular, in such FIG. 5, the threshold distributions D1pre and D2pre of the central levels "10" and "01" after the pre-programming steps are indicated with dot lines and it is shown how, advantageously, they are positioned at levels $PV_1'$ and $PV_2'$, respectively, lower than the final desired levels $PV_1$ and $PV_2$.

Moreover, from the representation of FIG. 5, it is immediate to verify how the programming method according to the invention allows to optimize the positioning of the reading reference values (indicated with R1, R2 and R3 in the figure). Such repositioning of the reading reference levels occurs in such a way as to dedicate to the allotment of the logic level distribution also a threshold voltage space due to the residual widening of the distribution as effect of the lateral coupling.

Figure 6:
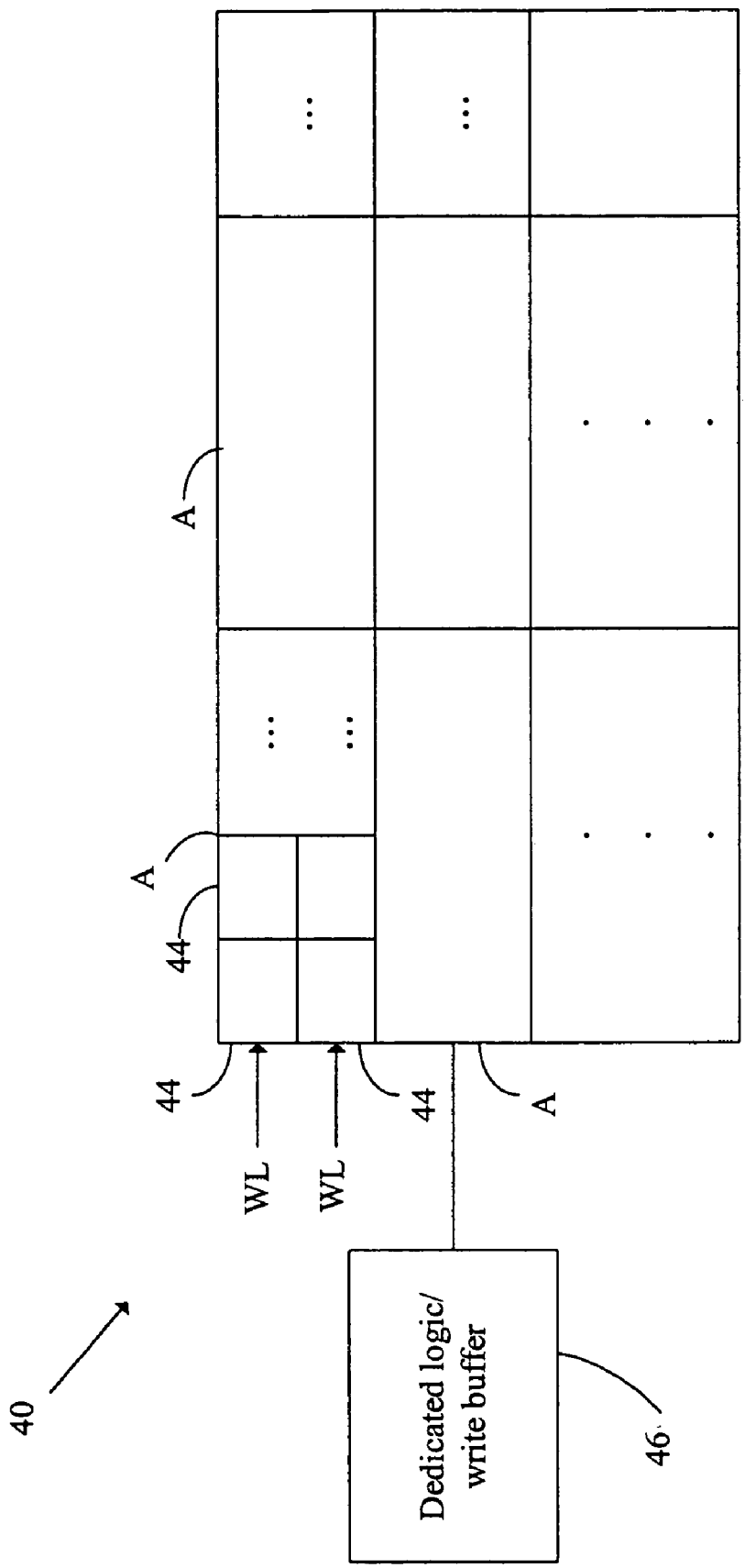
FIG. 6 schematically shows a memory device accordingly to one embodiment of the present invention.

Advantageously, the memory device 40 suitable to implement the method described is also provided and is schematically shown in FIG. 6.

In particular, the memory device 40 comprises a matrix 42 of memory cells 44 that are grouped into the electrically insulated blocks A; and a dedicated logic block 46 suitable to perform the initial separation and redistribution step of a sequence of bytes into bit packages each one to be allotted to different blocks A of the memory matrix. As can be seen in the embodiment of FIG. 6, each block A includes memory cells 44 coupled to two wordlines WL although one skilled in the art would recognize that the invention could be employed with blocks of cells coupled to one one wordline or more than two wordlines if the blocks are electrically insulated from each other.

It is noted that such dedicated logic block is, in reality, already present in multilevel memory devices and it is the so called write buffer. In the case of two-level memory devices it is instead necessary to suitably introduce such dedicated logic block which will be however indicated with the term write buffer for uniformity and simplicity of exposition.

The distance, in terms of number of memory cells, between the source contacts Ts—and thus the size of the electrically insulated blocks A—determines the minimum size of such write buffer.

Considering for example a memory device with a distance between two source contacts Ts equal to sixteen cells, the minimum write buffer, which allows the complete writing of an electrically insulated matrix block A with cells arranged on two levels with eight output terminals, must have size equal to:

2bits/cell×16 cells×2 rows×8 outputs=512 bits=64 bytes.

Advantageously, the programming is in fact performed on at least two word lines, simultaneously.

In general, the minimum dimension Dwr of the write buffer is equal to:

Dwb=nbit×ncell×nwl×nout wherein ncell is the number of cells comprised in each wordline of the block A;

nbit is the number of bits stored in each cell;

nwl the number of wordlines the cells belong to; and nout the number of outputs of the block A.

The write buffer thus takes care of sending to the memory device the data to be programmed as long sequences of bytes, instead than single words.

It should be noted that the memory device is programmed in blocks and that, once a block has been programmed, it is no more modified.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A method for programming a memory device that includes a memory cell matrix, the method comprising:
    erasing memory cells of the memory cell matrix;
    soft programming a first group of said memory cells, the first group of memory cells involving cells belonging to a first block of said matrix, the first block being electrostatically insulated from other blocks of cells of said matrix so as to reduce capacitive coupling between said first block and said other blocks; and
    completely programming the first group of memory cells without simultaneously programming memory cells that are not in the first block of said matrix, each of the memory cells in the first group storing its own logic value.

2. The programming method according to claim 1, further comprising initially separating and redistributing a sequence of bytes into bit packages, each bit package being allotted to a separate block of a plurality of said blocks of said memory matrix, the blocks being electrostatically insulated from each other so as to reduce capacitive coupling between said blocks.

3. The programming method according to claim 1, wherein said completely programming simultaneously involves cells belonging to one or more word lines of said memory cell matrix.

4. The programming method according to claim 1, wherein said erasing is performed by using a reduced value of an erasing voltage reference.

5. The programming method according to claim 4, wherein said reduced value of said erasing voltage reference is equal to a standard erasing voltage reference decreased by a value corresponding to a maximum disturb value due to capacitive coupling between adjacent cells in said memory matrix.

6. The programming method according to claim 1, further comprising partially programming a second group of cells of said first block, each cell of the second group storing its own logic value, suitable to bring said cells of the second group to a threshold value near a first threshold value lower than a first standard threshold value.

7. The programming method according to claim 6, further comprising performing a complete final programming of said second group of cells by using a sequence of tests and successive programming pulses.

8. The programming method according to claim 7, further comprising repeating said complete programming, partial programming and final programming on all of a plurality of said blocks of cells of said memory device, the blocks being electrostatically insulated from each other so as to reduce capacitive coupling between said blocks.

9. The programming method according to claim 6, further comprising partially programming a third group of cells of said first block, each cell of the third group storing its own logic value, suitable to bring said cells of the third group to a threshold value near a second threshold value lower than a second standard threshold value.

10. The programming method according to claim 9, further comprising performing a complete final programming of said second and third groups of cells by using a sequence of tests and successive programming pulses.

11. The programming method according to claim 10, further comprising repeating said complete programming, partial programming of the second group of cells, partial programming of the third group of cells, and final programming on all of a plurality of said blocks of cells of said memory device, the blocks being electrostatically insulated from each other so as to reduce capacitive coupling between said blocks.

12. The programming method according to claim 10, further comprising optimizing positions of reading reference values.

13. The programming method according to claim 12, wherein said optimizing determines said reading reference values so that a threshold voltage range dedicated to alloting threshold distributions also includes a range due to a residual widening caused by lateral coupling between memory cells of the matrix.

14. A memory device, comprising:
    a memory cell matrix of memory cells; and
    a dedicated logic block coupled to said memory cell matrix and suitable to perform a separation and redistribution of a sequence of bytes into bit packages, each bit package being sent to a respective block of a plurality of blocks of said memory matrix, the blocks being electrically insulated from each other.

15. The memory device according to claim 14, wherein said dedicated logic block is sized based on a number of cells (ncell) comprised in each wordline of each block, a number of bits (nbit) stored by each cell, a number of wordlines (nwl) in each block, and a number of outputs (nout) of said block according to a relation:

$$Dwb = nbit \times ncell \times nwl \times nout$$

Dwb being a minimum size of said dedicated logic block.

16. The memory device according to claim 14, wherein each block is delimited by source and drain contacts of said memory cell matrix.

17. The memory device according to claim 14, wherein each block belongs to a single respective wordline and each block is delimited by source and drain contacts and by a source diffusion of said memory cell matrix.

18. A method for programming a memory device that includes a memory cell matrix, the method comprising:
    erasing memory cells of the memory cell matrix;
    soft programming the erased memory cells;
    receiving a byte sequence of bytes, each byte including a plurality of bits;
    redistributing the bits of the byte sequence into bit packages respectively allotted to respective blocks of a plurality of blocks of the matrix, each block being electrically insulated from each other; and
    completely programming a first group of memory cells in a first block of the plurality of blocks without simultaneously programming memory cells that are not in the first block.

19. The programming method according to claim 18, further comprising programming a second group of cells of the first block after completely programming the first group of cells, each of the cells of the first group being programmed to a first logic value and each of the cells of the second group being programmed to a second logic value.

20. The programming method according to claim 19 wherein said programming the second group of cells includes:
    partially programming the second group of cells by bringing the cells of the second group to a threshold value near a reduced threshold value lower than a standard threshold value; and
    completing programming of the second group of cells by bringing the cells of the second group to the standard threshold value.

* * * * *